United States Patent
Wakabayashi et al.

(10) Patent No.: US 9,730,322 B2
(45) Date of Patent: Aug. 8, 2017

(54) PRODUCTION METHOD OF COMPONENT-EMBEDDED SUBSTRATE, AND COMPONENT-EMBEDDED SUBSTRATE

(71) Applicant: Murata Manufacturing Co., Ltd., Nagaokakyo-shi, Kyoto-fu (JP)

(72) Inventors: Yuki Wakabayashi, Nagaokakyo (JP); Shigeru Tago, Nagaokakyo (JP); Daisuke Tsuruga, Nagaokakyo (JP); Masaki Kawata, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/878,287

(22) Filed: Oct. 8, 2015

(65) Prior Publication Data
US 2016/0029489 A1 Jan. 28, 2016

Related U.S. Application Data

(63) Continuation of application No. PCT/JP2014/074619, filed on Sep. 18, 2014.

(30) Foreign Application Priority Data

Oct. 15, 2013 (JP) .................................. 2013-215016

(51) Int. Cl.
*H05K 1/16* (2006.01)
*H05K 1/11* (2006.01)
(Continued)

(52) U.S. Cl.
CPC ........... *H05K 1/115* (2013.01); *H03H 7/0115* (2013.01); *H05K 1/028* (2013.01); *H05K 1/0298* (2013.01);
(Continued)

(58) Field of Classification Search
CPC ...... H05K 1/115; H05K 1/028; H05K 1/0298; H05K 1/186; H05K 3/32; H03H 7/0115
(Continued)

(56) References Cited

U.S. PATENT DOCUMENTS

| | | | |
|---|---|---|---|
| 2013/0213699 A1 | 8/2013 | Chisaka | |
| 2015/0163918 A1* | 6/2015 | Baba | ....................... H01L 24/20 |
| | | | 361/762 |
| 2016/0044798 A1* | 2/2016 | Kawata | .................. H05K 1/185 |
| | | | 29/840 |

FOREIGN PATENT DOCUMENTS

| | | |
|---|---|---|
| CN | 103141164 A | 6/2013 |
| JP | 58-14545 A | 1/1983 |

(Continued)

OTHER PUBLICATIONS

Official Communication issued in International Patent Application No. PCT/JP2014/074619, mailed on Oct. 14, 2014.
(Continued)

*Primary Examiner* — Tremesha S Willis
(74) *Attorney, Agent, or Firm* — Keating & Bennett, LLP

(57) ABSTRACT

A component-embedded substrate includes a cavity including through-holes penetrating through resin sheets in a stacked body of resin sheets having flexibility. An electronic chip component including external electrodes is disposed in the cavity. The resin sheet on which the electronic chip component is located is provided with through-holes into which conductive pastes are filled. The resin sheet includes cut-away portions communicating with a through-hole and located at a distance from each other across the through-hole. When this stacked body is hot-pressed, the conductive pastes overflow from the through-holes. However, the overflowing conductive pastes enter the cut-away portions.

12 Claims, 16 Drawing Sheets

(51) Int. Cl.
*H05K 1/18* (2006.01)
*H05K 3/46* (2006.01)
*H03H 7/01* (2006.01)
*H05K 1/02* (2006.01)
*H05K 3/00* (2006.01)
*H05K 3/32* (2006.01)
*H03H 1/00* (2006.01)
*H05K 3/34* (2006.01)

(52) U.S. Cl.
CPC .......... *H05K 1/186* (2013.01); *H05K 3/0064* (2013.01); *H05K 3/0094* (2013.01); *H05K 3/32* (2013.01); *H05K 3/4617* (2013.01); *H05K 3/4697* (2013.01); *H03H 2001/0085* (2013.01); *H05K 1/165* (2013.01); *H05K 3/3484* (2013.01); *H05K 2201/0141* (2013.01); *H05K 2201/09263* (2013.01); *H05K 2201/10015* (2013.01); *H05K 2201/10636* (2013.01); *H05K 2203/046* (2013.01); *H05K 2203/063* (2013.01); *H05K 2203/1484* (2013.01); *Y02P 70/611* (2015.11)

(58) Field of Classification Search
USPC .................................... 174/250, 255–262
See application file for complete search history.

(56) References Cited

FOREIGN PATENT DOCUMENTS

| | | |
|---|---|---|
| JP | 2003-17859 A | 1/2003 |
| JP | 2006-147822 A | 6/2006 |
| JP | 2007-27527 A | 2/2007 |
| JP | 2009-105345 A | 5/2009 |
| JP | 2012-89568 A | 5/2012 |

OTHER PUBLICATIONS

Official Communication issued in Japanese Patent Application No. 2015-522822, mailed on Jun. 30, 2015.

* cited by examiner

PRODUCTION METHOD OF COMPONENT-EMBEDDED SUBSTRATE, AND COMPONENT-EMBEDDED SUBSTRATE

BACKGROUND OF THE INVENTION

1. Field of the Invention

The present invention relates to a production method of a component-embedded substrate including an electronic chip component mounted in a substrate, and a component-embedded substrate.

2. Description of the Related Art

Various configurations in which an electronic chip component is mounted in a multilayer substrate including a plurality of dielectric layers have conventionally been proposed. For example, a printed substrate described in the Japanese Unexamined Patent Publication No. 2003-17859 is formed by a production process in which a plurality of thermoplastic resin sheets are stacked, and these sheets are integrated by hot pressing. During this production process, hot pressing is performed with an electronic chip component being held between the resin sheets and then the electronic chip component is embedded into the printed substrate to be fixed.

This printed substrate has a conductor pattern formed therein for connecting the electronic chip component to an external circuit. The conductor pattern and an external electrode of the electronic chip component are connected through a conductive via.

Such a connection configuration is implemented by the following production process.

The electronic chip component is disposed in a cavity formed of a concave part or a through-hole formed in the resin sheet. At least one of the resin sheets holding the electronic chip component is provided with a through-hole (via hole) at the position against which the external electrode of the electronic chip component abuts. The stacked plurality of resin sheets is hot-pressed with a conductive paste being filled in the through-hole and with the electronic chip component being held. In this case, the electronic chip component can be disposed as positioned to a desired location in the printed substrate due to the presence of the cavity.

The conductive paste is melted and sintered contacting with the external electrode of the electronic chip component and the conductor pattern. With this process, the external electrode of the electronic chip component and the conductor pattern are connected to each other through the conductive via.

In this process, more conductive paste is preferably filled in the through-hole. In addition, the conductive paste is preferably enough so as to rise from the surface of the through-hole. Filling the conductive paste as described above ensures the connection between the external electrode of the electronic chip component and the conductor pattern through the conductive via after the hot pressing.

However, the component-embedded substrate having the configuration described above has following problems. FIGS. 16A and 16B are views each for describing a problem of a component-embedded substrate having a conventional configuration. FIG. 16A is a side sectional view, and FIG. 16B is a plan view illustrating a plane where a conductive via and an external electrode of an electronic chip component are bonded.

The above component-embedded substrate having the conventional configuration is formed by hot-pressing a plurality of thermoplastic resin sheets. In this process, the conductive paste rising from the surface of the through-hole (via hole) and the conductive paste filled in the through-hole overflow from the through-hole with the pressing.

The cavity is formed to have an opening area slightly larger than the dimension of the electronic chip component due to the reasons such as facilitation of the insertion of the electronic chip component. Therefore, the overflowing conductive paste enters a gap between the electronic chip component in the cavity and a wall surface of the cavity. When the conductive paste is melted by an application of heat, its fluidity is increased. Accordingly, the melted conductive paste might flow over a wider range through the gap in the cavity. When the resin sheet is melted to fill the cavity with this hot press, the conductive paste flowing into the gap in the cavity might be sintered on the spot to remain around the electronic chip component.

With this, in a component-embedded substrate 10P having the conventional configuration, a first external electrode 31 of an electronic chip component 30 fixed in a resin substrate 20P and a conductor pattern 421 are connected to each other through a conductive via 521, and a second external electrode 32 of the electronic chip component 30 and a conductor pattern 422 are connected to each other through a conductive via 522, and in addition, the first external electrode 31 and the second external electrode 32 might be short-circuited with a leaking conductor 550 which flows and is sintered, as illustrated in FIGS. 16A and 16B.

SUMMARY OF THE INVENTION

Accordingly, preferred embodiments of the present invention provide a production method of a component-embedded substrate and a component-embedded substrate that surely prevents a plurality of external electrodes of an embedded electronic chip component from being short-circuited.

A preferred embodiment of the present invention provides a production method of a component-embedded substrate for producing a component-embedded substrate by stacking a plurality of resin sheets, each having thermoplasticity, and by performing hot pressing with an electronic chip component being held between the resin sheets. The production method of a component-embedded substrate according to the present preferred embodiment of the present invention includes a step of forming a through-hole filled with a conductive paste at a position of the resin sheet, the position corresponding to an external electrode of the electronic chip component. The production method of a component-embedded substrate according to the present preferred embodiment of the present invention includes a step of forming a cavity and a cut-away portion in the resin sheet corresponding to the position where the electronic chip component is to be disposed, the cavity having an area that is the same or substantially same as an area of the electronic chip component in a plan view and having a shape following an outer shape of the electronic chip component, the cut-away portion communicating with the cavity. The production method of a component-embedded substrate according to the present preferred embodiment of the present invention includes a step of inserting the electronic chip component into the cavity; and a step of stacking the plurality of resin sheets with the electronic chip component being disposed in the cavity and performing hot pressing to stacked resin sheets. In the component-embedded substrate, the external electrode includes a first external electrode and a second external electrode provided respectively to the vicinity of both ends of the electronic chip component in a first direction. In the component-embedded substrate, the through-hole into which the conductive paste is filled is formed for each of the first external electrode and the second external electrode. In the component-embedded substrate, the cut-away portion is independently formed for each of the first external electrode and the second external electrode.

According to the production method described above, when the plurality of resin sheets are stacked with the electronic chip component being disposed in the cavity and hot pressing is performed to the stacked sheets, a conductive paste overflowing from the through-hole also enters the cut-away portion. Therefore, the amount of the conductive paste entering a gap between the external electrodes in the cavity is significantly reduced, and this prevents the gap between the external electrodes from being filled with the conductive paste. When the conductive paste is melted and sintered with this state, a conductor (staying conductor) formed after the conductive paste entering the cut-away portion is melted and sintered stays at the position where the cut-away portion was located. This prevents the external electrodes from being short-circuited.

In a production method of a component-embedded substrate according to a preferred embodiment of the present invention, the cut-away portion is preferably formed in the vicinity of a position where the external electrode of the electronic chip component is disposed.

According to this production method, the conductive paste overflowing from the through-hole is easier to enter the cut-away portion.

In a production method of a component-embedded substrate according to a preferred embodiment of the present invention, the cut-away portion is preferably formed in at least a resin sheet that is adjacent to the resin sheet provided with the through-hole into which the conductive paste is filled, out of the plurality of resin sheets.

According to this configuration, the conductive paste overflowing from the through-hole is easier to enter the cut-away portion.

In a production method of a component-embedded substrate according to a preferred embodiment of the present invention, the cut-away portion formed for the first external electrode and the cut-away portion formed for the second external electrode are preferably formed to be opposite to each other sandwiching the electronic chip component therebetween in a state in which the electronic chip component is disposed in the cavity.

In this production method, the cut-away portion for the first external electrode and the cut-away portion formed for the second external electrode are formed to be opposite to each other and apart from each other sandwiching the electronic chip component therebetween in a state in which the electronic chip component is disposed into the cavity. Therefore, the space between the conductive pastes entering the respective cut-away portions is increased, such that the contact of these conductive pastes is further prevented. Accordingly, the short-circuiting between the external electrodes is further suppressed.

In a production method of a component-embedded substrate according to a preferred embodiment of the present invention, the number of at least one of the cut-away portion formed for the first external electrode and the cut-away portion formed for the second external electrode is preferably two or more.

This production method increases an allowable amount (storage amount) of the conductive paste for the cut-away portion as a whole.

Preferably, in a production method of a component-embedded substrate according to a preferred embodiment of the present invention, a through-hole, into which the conductive paste is filled, for the first external electrode is disposed around one end in a second direction which is perpendicular or substantially perpendicular to both the first direction and a thickness direction of the electronic chip component, and a through-hole, into which the conductive paste is filled, for the second external electrode is disposed around the other end in the second direction.

With this production method, the space between the through-holes into which the conductive pastes are filled becomes large. Therefore, the initial space of the overflowing conductive pastes also becomes large.

Preferably, the production method of a component-embedded substrate according to a preferred embodiment of the present invention further includes a step of forming a flow checking conductor pattern on an inner wall of the cut-away portion.

With this production method, the short-circuiting between the external electrodes is more reliably prevented with the staying conductor, because the melted conductive paste wetly spreads on the flow checking conductor pattern.

In a production method of a component-embedded substrate according to a preferred embodiment of the present invention, a width of the cut-away portion is preferably larger than a gap generated between a side surface of the cavity and the electronic chip component when the electronic chip component is disposed in the cavity.

With this production method, the conductive paste overflowing from the through-hole is easier to enter the cut-away portion.

Preferably, a component-embedded substrate according to a preferred embodiment of the present invention includes a resin substrate including a stack of a plurality of resin sheets each having thermoplasticity; a conductor pattern provided in the resin substrate; an electronic chip component disposed in the resin substrate and including a first external electrode and a second external electrode; a first interlayer connection conductor connecting the first external electrode to the conductor pattern; a second interlayer connection conductor connecting the second external electrode to a conductor pattern different from the conductor pattern connected to the first interlayer connection conductor; and a staying conductor which is present in the vicinity of an interface between the electronic chip component and the resin substrate so as to protrude toward a side of the resin substrate, and which is conducted to one of the first external electrode and the second external electrode but not conducted to the other one. In the component-embedded substrate, a flow checking conductor pattern that is in contact with the staying conductor is provided in at least a portion of a portion surrounding a position where the electronic chip component is to be disposed.

This configuration prevents the first and second external electrodes from being short-circuited due the conductive pastes remaining between the first and second external electrodes, the conductive paste being used for the interlayer connection conductor to connect the first and second external electrodes to the conductor patterns. The staying conductor wetly spreads and is solidified on the flow checking conductor pattern, such that the short-circuiting between the external electrodes is further reduced by the staying conductor.

A component-embedded substrate according to a preferred embodiment of the present invention preferably has the configurations described below. The first external electrode extends to one end surface in a first direction of the electronic chip component, and extends from the one end surface in the first direction to respective side surfaces continuous with the one end surface. The second external electrode extends to the other end surface in the first direction of the electronic chip component, and extends from the other end surface in the first direction to respective side surfaces continuous with the other end surface. A staying conductor conducted to the first interlayer connection conductor is connected to the first external electrode on a surface of the first external electrode different from a surface of the first external electrode connected to the first interlayer connection conductor. A staying conductor conducted to the second interlayer connection conductor is connected to the second external electrode on a surface of the second external electrode different from a surface of the second external electrode connected to the second interlayer connection conductor.

With this configuration, the first and second external electrodes are connected to the conductor patterns with not only the interlayer connection conductors but also the staying conductors. This provides a component-embedded substrate having high reliability in the connection between the conductor pattern and the electronic chip component.

Various preferred embodiments of the present invention more reliably prevent the plurality of external electrodes on the electronic chip component embedded in the resin substrate from being short-circuited.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
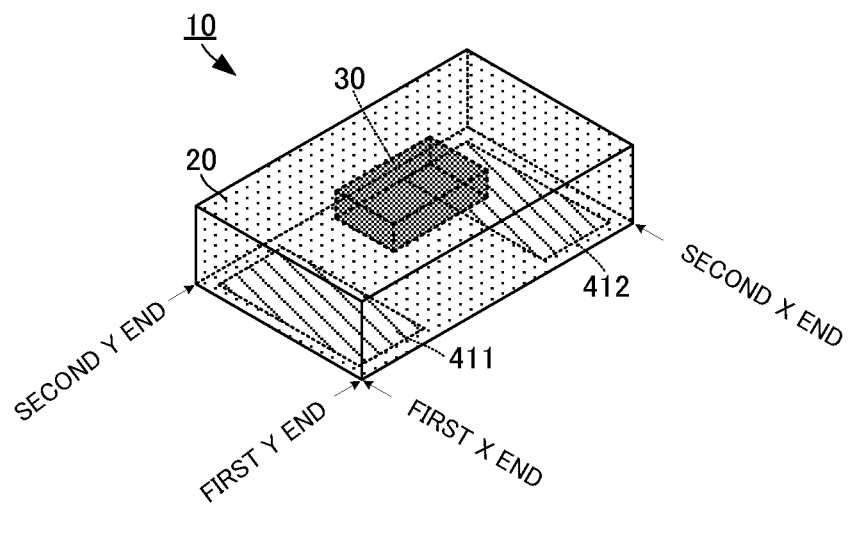
FIG. 1 is a perspective view illustrating a schematic configuration of a component-embedded substrate according to a first preferred embodiment of the present invention.
Figure 1:
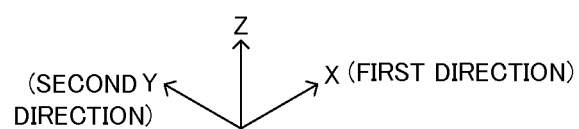
Figure 2A:
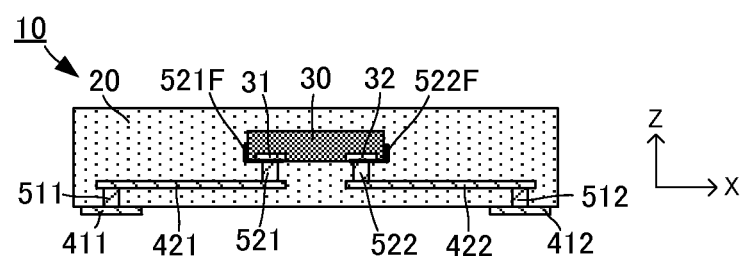
FIGS. 2A and 2B are each a sectional view for illustrating a structure of the component-embedded substrate and a perspective plan view of the electronic chip component on a mounting surface according to the first preferred embodiment of the present invention.

A component-embedded substrate according to a first preferred embodiment of the present invention and a production method of the component-embedded substrate will be described with reference to the drawings. FIG. 1 is a perspective view illustrating a schematic configuration of a component-embedded substrate according to a first preferred embodiment of the present invention. FIG. 2A is a sectional view illustrating a structure of the component-embedded substrate according to the first preferred embodiment, and FIG. 2B is a perspective plan view of the electronic chip component on a mounting surface of the component-embedded substrate according to the first preferred embodiment of the present invention.

Figure 2B:
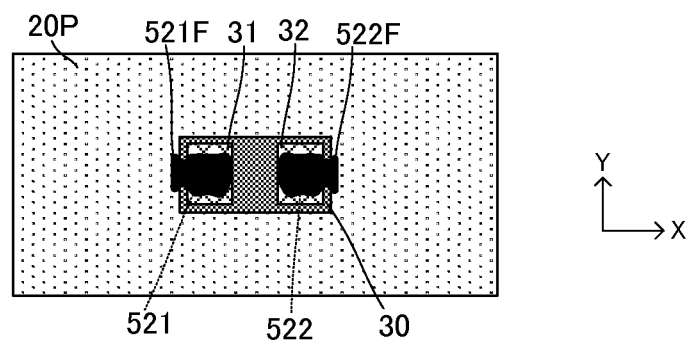

As illustrated in FIGS. 1, 2A, and 2B, a component-embedded substrate 10 includes a substrate body 20 and an electronic chip component 30 disposed in the substrate body 20.

The substrate body 20 preferably has a cuboid shape, and is formed by stacking a plurality of insulating resin sheets and performing hot pressing to the stacked sheets. External mounting electrodes 411 and 412 are provided on a bottom surface of the substrate body 20. As illustrated in FIG. 1, the external mounting electrode 411 is provided around one end (first X end) of the cuboid substrate body 20 in a first direction that is an X direction. The external mounting electrode 412 is provided around the other end (second X end) of the substrate body 20 in the X direction.

The electronic chip component 30 has a cuboid shape. The electronic chip component 30 includes external electrodes 31 and 32. The external electrodes 31 and 32 are provided around opposing both ends of a body of the electronic chip component 30. The external electrodes 31 and 32 are provided on the bottom surface of the body of the electronic chip component 30.

Internal conductor patterns 421 and 422 are disposed inside of the substrate body 20. The internal conductor patterns 421 and 422 are disposed between the positions of the external electrodes 31 and 32 of the electronic chip component 30 and the bottom surface of the substrate body 20 in the thickness direction of the substrate body 20.

One end of the internal conductor pattern 421 in the extending direction is connected to the external mounting electrode 411 via an interlayer connection conductor 511. The other end of the internal conductor pattern 411 in the extending direction is connected to the external electrode 31 of the electronic chip component 30 via an interlayer connection conductor 521.

One end of the internal conductor pattern 422 in the extending direction is connected to the external mounting electrode 412 via an interlayer connection conductor 512. The other end of the internal conductor pattern 412 in the extending direction is connected to the external electrode 31 of the electronic chip component 30 via an interlayer connection conductor 522.

The electronic chip component 30 is fixed in the substrate body 20 so as to be molded with resin of the substrate body 20. In this case, a staying conductor 521F is provided in the vicinity of an interface, closer to the external electrode 31, between the electronic chip component 30 and the substrate body so as to protrude toward the substrate body 20 side, and a staying conductor 522F is provided in the vicinity of the interface, closer to the external electrode 32, between the electronic chip component 30 and the substrate body 20 so as to protrude toward the substrate body 20 side. The staying conductors 521F and 522F spread to the interfaces between both end surfaces of the electronic chip component and the substrate body 20 from the interfaces against which the external electrodes 31 and 32 abut. The staying conductor 521F and the staying conductor 522F are not connected to each other.

Figure 3A:
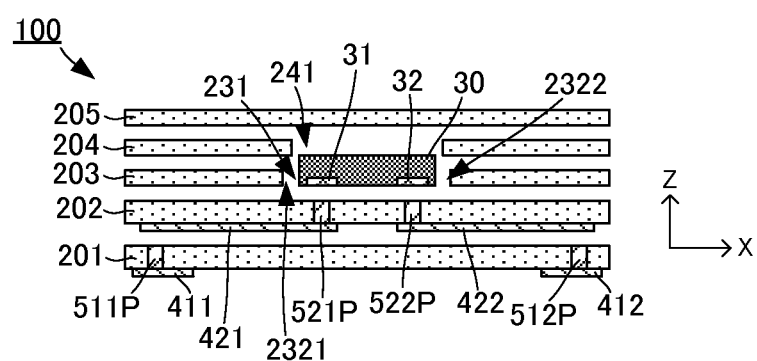
FIGS. 3A and 3B are each a side sectional view illustrating a stacked manner of the respective resin sheets in the component-embedded substrate, and a plan view illustrating an arrangement manner of the resin sheet on which the electronic chip component is disposed and the electronic chip component according to the first preferred embodiment of the present invention.
Figure 3B:
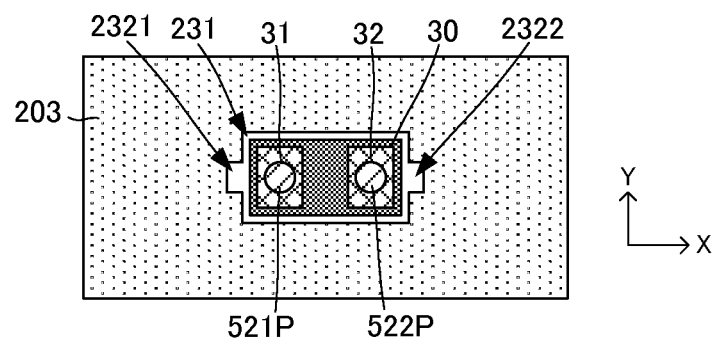

The component-embedded substrate 10 thus configured is produced with processes described below. FIG. 3A is a side sectional view illustrating a stacked manner of the respective resin sheets in the component-embedded substrate according to the first preferred embodiment of the present invention, and FIG. 3B is a plan view illustrating an arrangement manner of the resin sheet on which the electronic chip component is disposed and the electronic chip component.

The substrate body 20 includes a stacked body 100 formed preferably by stacking a plurality of insulating resin sheets 201, 202, 203, 204, and 205. The insulating resin sheets 201, 202, 203, 204, and 205 are made of a material having thermoplasticity. For example, they are made of a material having liquid crystal polymer (LCP) as a main component.

The external mounting electrodes 411 and 412 are provided on the bottom surface of the resin sheet 201 that is the lowermost layer of the stacked body 100. The external mounting electrodes 411 and 412 are made of a metal such as copper (Cu). For example, the resin sheet 201 with the external mounting electrodes 411 and 412 can be implemented by performing an electrode patterning to a liquid crystal polymer having copper applied to one surface.

The resin sheet 201 is provided with a through-hole into which a conductive paste 511P is filled and a through-hole into which a conductive paste 512P is filled. The through-hole into which the conductive paste 511P is filled is formed in a region where the external mounting electrode 411 is formed, and more preferably, this through-hole is formed at the center of the region where the external mounting electrode 411 is formed. The through-hole into which the conductive paste 512P is filled is formed in a region where the external mounting electrode 412 is formed, and more preferably, this through-hole is formed at the center of the region where the external mounting electrode 412 is formed.

The internal conductor patterns 421 and 422 are provided on the bottom surface of the resin sheet 202. The internal conductor patterns 421 and 422 are made of a metal such as copper (Cu). For example, the resin sheet 202 with the internal conductor patterns 421 and 422 can be implemented by performing an electrode patterning to a liquid crystal polymer having copper applied to one surface.

In the state in which the internal conductor pattern 421 is stacked on the resin sheet 201, one end of the internal conductor pattern 421 in the extending direction reaches the position of the resin sheet 201 where the through-hole having the conductive paste 511P filled therein is formed. The other end of the internal conductor pattern 421 in the extending direction reaches an inside of a later-described through-hole 231 of the resin sheet 203.

In the state in which the internal conductor pattern 422 is stacked on the resin sheet 201, one end of the internal conductor pattern 422 in the extending direction reaches the position of the resin sheet 201 where the through-hole having the conductive paste 512P filled therein is formed. The other end of the internal conductor pattern 422 in the extending direction reaches an inside of a later-described through-hole 231 of the resin sheet 203.

The resin sheet 202 is provided with a through-hole into which a conductive paste 521P is filled and a through-hole into which a conductive paste 522P is filled. The through-hole into which the conductive paste 521P is filled is formed around the other end of the internal conductor pattern 421 and in a region where the internal conductor pattern 421 is formed. The through-hole into which the conductive paste 522P is filled is disposed around the other end of the internal conductor pattern 422 and in a region where the internal conductor pattern 422 is located.

The resin sheet 203 is provided with the through-hole 231 and cut-away portions 2321 and 2322. The through-hole 231 penetrates through the resin sheet 203 in the thickness direction. The outer shape of the through-hole 231 is almost the same as the outer shape of the electronic chip component 30 viewed from top, and is larger than the outer shape of the electronic chip component 30 viewed from top. Specifically, the through-hole 231 has an opening shape following the outer shape of the electronic chip component 30 in a plan view. The difference in size between the outer shape of the electronic chip component 30 and the opening shape of the through-hole 231 is preferably as small as possible. However, this difference is determined based on a mounting error or other factors of the electronic chip component 30 during the production.

Similar to the through-hole 231, the cut-away portions 2321 and 2322 penetrate through the resin sheet 203 and communicate with the through-hole 231. The cut-away portion 2321 is located on a wall surface of the through-hole 231 at the first X end, while the cut-away portion 2322 is located on the wall surface of the through-hole 231 at the second X end. In other words, the cut-away portion 2321 is located on the opposite side of the cut-away portion 2322 across the through-hole 231.

The length of each of the cut-away portions 2321 and 2322, i.e., the width of each of the cut-away portions 2321 and 2322, is shorter than the length of the through-hole 231 along the Y direction.

The cut-away portions 2321 and 2322 are located on almost the center of the through-hole 231 in the Y direction. From the viewpoint of their functions, the cut-away portions 2321 and 2322 are located around the conductive pastes 511P and 512P when the resin sheet 203 is stacked on the resin sheet 202.

A through-hole 241 is provided in the resin sheet 204. The through-hole 241 penetrates through the resin sheet 204 in the thickness direction. The outer shape of the through-hole 241 is almost the same as the outer shape of the electronic chip component 30 viewed from top, and is larger than the outer shape of the electronic chip component 30 viewed from top. Specifically, the through-hole 241 preferably has the same shape and on the same region as the through-hole 231 in the resin sheet 203.

These through-holes 231 and 241 define a cavity.

Preferably, no conductor patterns and through-holes are formed in the resin sheet 205. However, these elements can be additionally formed, as necessary, according to the specification of the component-embedded substrate.

The resin sheets 201 to 205 having the configurations described above are stacked. The electronic chip component 30 is put in the cavity defined by the through-holes 231 and 241 of the stacked body. The electronic chip component 30 is disposed in the cavity such that the external electrode 31 is disposed on the through-hole into which the conductive paste 521P is filled and the external electrode 32 is disposed on the through-hole into which the conductive paste 522P is filled.

Then, hot pressing processing is performed to the stacked body including the resin sheets 201 to 205 with the electronic chip component 30 being disposed in the cavity. The conductive pastes 511P and 512P are melted and sintered with this hot pressing processing. Thus, interlayer connection conductors 511, 512, 521, and 522 are formed.

The interlayer connection conductor 511 electrically and physically connects the external mounting electrode 411 and the internal conductor pattern 421 to each other along the stacking direction. The interlayer connection conductor 512 electrically and physically connects the external mounting electrode 412 and the internal conductor pattern 422 to each other along the stacking direction.

The interlayer connection conductor 521 electrically and physically connects the internal conductor pattern 421 and the external electrode 31 of the electronic chip component 30 to each other. The interlayer connection conductor 522 electrically and physically connects the internal conductor pattern 422 and the external electrode 32 of the electronic chip component 30 to each other.

With this, the external electrode 31 of the electronic chip component 30 is connected to the external mounting electrode 411 of the component-embedded substrate 10, and the external electrode 32 of the electronic chip component 30 is connected to the external mounting electrode 412 of the component-embedded substrate 10.

In addition, with the hot pressing described above, the resin sheets 201 to 205 are melted, so that the cavity is filled. Therefore, the electronic chip component 30 is molded with the substrate body 20. The resin sheets 201 to 205 are then solidified, such that the electronic chip component 30 is fixed in the substrate body 20. Thus, the connection reliability between the external electrodes 31 and 32 of the electronic chip component 30 and the external mounting electrodes 411 and 412 of the component-embedded substrate 10 is enhanced.

The conductive pastes 521P and 522P sometimes overflow from the through-holes into which they are filled toward the cavity, when the resin sheets 201 to 205 are hot-pressed. The overflowing conductive pastes 521P and 522P flow into a gap formed between the wall surface of the cavity and the electronic chip component 30.

In the present preferred embodiment, the cut-away portions 2321 and 2322 are preferably provided. Thus, the overflowing conductive pastes 521P and 522P enter the cut-away portions 2321 and 2322. Strictly speaking, the overflowing conductive paste 521P enters the cut-away portion 2321 through the gap of the cavity around the through-hole. The overflowing conductive paste 522P enters the cut-away portion 2322 through the gap of the cavity around the through-hole. The conductive pastes 521P and 522P entering the cut-away portions 2321 and 2322 in this way stay there, and then, are melted and sintered due to the melting of the resin sheets. This forms a staying conductor 521F based on the conductive paste 521P and a staying conductor 522F based on the conductive paste 522P. Since the resin sheets 201 to 205 are uniformly pressurized as a whole, these staying conductors 521F and 522F stay at the position where the cut-away portions 2321 and 2322 are formed, even if the cavity is eliminated due to the melting of the resin sheets.

The cut-away portions 2321 and 2322 are opposite to each other across the cavity and the electronic chip component 30. Therefore, the staying conductors 521F and 522F are opposite to each other across the electronic chip component 30. This structure prevents the conductive pastes overflowing from the through-holes from being in communication with each other, i.e., prevent the staying conductors 521F and 522F from being in communication with each other, thus being capable of suppressing an occurrence of short-circuiting between the external electrodes 31 and 32 and an occurrence of short-circuiting between the interlayer connection conductors 521 and 522.

The width of each of the cut-away portions 2321 and 2322 is preferably larger than the width of the gap between the wall surface of the cavity and the electronic chip component 30 disposed in the cavity. The conductive pastes 521P and 522P are easier to enter the cut-away portions 2321 and 2322 than to enter the gap between the wall surface of the cavity and the electronic chip component 30 by increasing the width of each of the cut-away portions 2321 and 2322. Thus, the occurrence of short-circuiting between the external electrodes 31 and 32 and between the interlayer connection conductors 521 and 522 is more surely reduced.

The cut-away portions 2321 and 2322 are preferably located at the position around the through-holes into which the conductive pastes 521P and 522P are filled. According to the formation of the cut-away portions 2321 and 2322 around the through-holes as described above, the conductive pastes 521P and 522P overflowing from the through-holes easily enter the cut-away portions 2321 and 2322. Thus, the occurrence of short-circuiting between the external electrodes 31 and 32 and between the interlayer connection conductors 521 and 522 is more surely prevented.

In the present preferred embodiment, the cut-away portions preferably are provided only in the resin sheet 203, and they are not provided in the resin sheet 204. However, the cut-away portion may also be provided in the resin sheet 204. Specifically, at least one of a cut-away portion in communication with the through-hole 241 and the cut-away portion 2321 and a cut-away portion in communication with the through-hole 241 and the cut-away portion 2322 may be provided.

The cut-away portions in the resin sheet 203 may be eliminated, and the cut-away portion may be provided in the resin sheet 204. However, the conductive paste is able to be effectively inserted into the cut-away portion with the structure in which the cut-away portion is formed in the resin sheet provided with the through-hole into which the conductive paste is filled.

Figure 4:
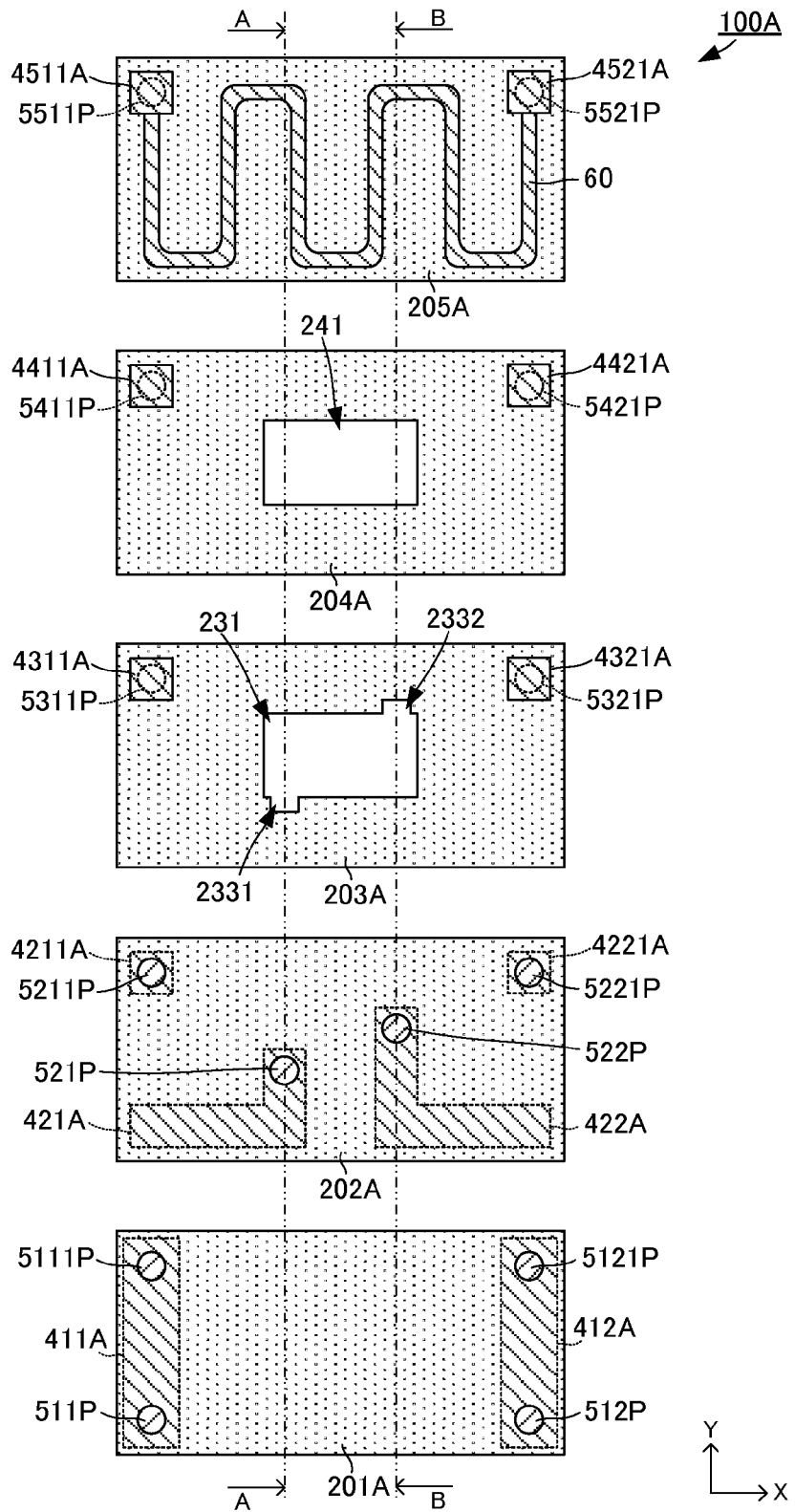
FIG. 4 is a plan view illustrating respective resin sheets forming a component-embedded substrate according to a second preferred embodiment of the present invention.
Figure 5A:
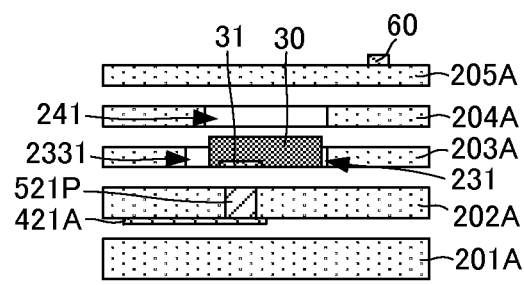
FIGS. 5A and 5B are side sectional views each illustrating a stacked manner of the respective resin sheets in the component-embedded substrate according to the second preferred embodiment of the present invention.
Figure 5A:
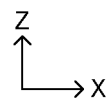
Figure 5B:
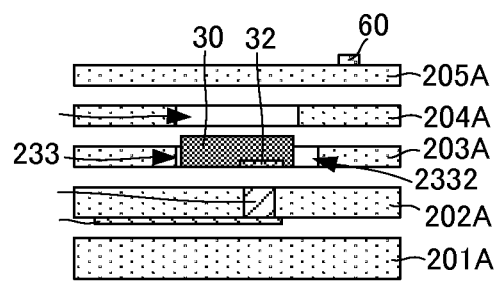
Figure 5B:
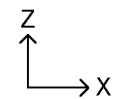
Figure 6A:
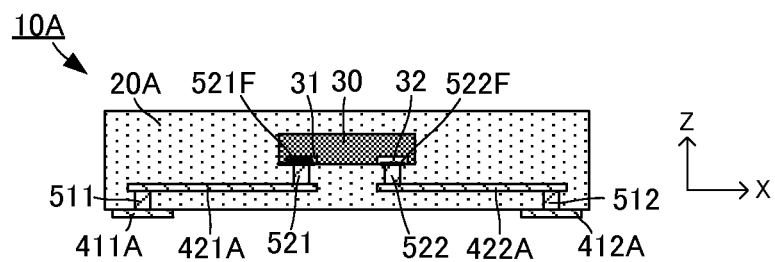
FIGS. 6A and 6B are each a sectional view for illustrating a structure of the component-embedded substrate and a perspective plan view of the electronic chip component on a mounting surface according to the second preferred embodiment of the present invention.
Figure 6B:
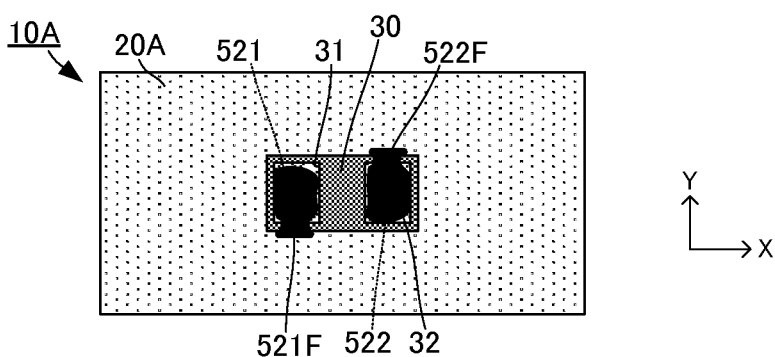

Next, a component-embedded substrate and a production method of the component-embedded substrate according to a second preferred embodiment of the present invention will be described with reference to the drawings. FIG. 4 is a plan view illustrating respective resin sheets forming a component-embedded substrate according to a second preferred embodiment of the present invention. FIGS. 5A and 5B are side sectional views each illustrating a stacked manner of the respective resin sheets in the component-embedded substrate according to the second preferred embodiment of the present invention. FIG. 5A is a sectional view along a line A-A in FIG. 4, and FIG. 5B is a sectional view along a line B-B in FIG. 4. FIG. 6A is a sectional view illustrating a structure of a component-embedded substrate according to the second preferred embodiment of the present invention, and FIG. 6B is a perspective plan view of an electronic chip component on a mounting surface of the component-embedded substrate according to the second preferred embodiment of the present invention. The basic configuration of a component-embedded substrate 10A according to the present preferred embodiment is the same as the component-embedded substrate 10 illustrated in the first preferred embodiment. In other words, the basic outer shape is the same as the component-embedded substrate 10 illustrated in FIG. 1 of the first preferred embodiment. However, the component-embedded substrate 10A according to the present preferred embodiment includes a linear conductor 60 and a resist film covering this linear conductor 60 on the surface of a substrate body.

The component-embedded substrate 10A includes a substrate body 20A and an electronic chip component 30 embedded in the substrate body 20A. The substrate body 20A is formed preferably by stacking resin sheets 201A to 205A, each having flexibility and insulating property, and by performing hot pressing to the stacked sheets.

External mounting electrodes 411A and 412A are formed on the bottom surface of the resin sheet 201A that is the lowermost layer of the stacked body 100A. The external mounting electrodes 411A and 412A are made of a metal such as copper (Cu). For example, the resin sheet 201A with the external mounting electrodes 411A and 412A preferably is implemented by performing an electrode patterning to a liquid crystal polymer having copper applied to one surface.

The resin sheet 201A is provided with a through-hole into which a conductive paste 511P is filled and a through-hole into which a conductive paste 512P is filled. The through-hole into which the conductive paste 511P is filled is provided in a region where the external mounting electrode 411A is located. The through-hole into which the conductive paste 512P is filled is provided in a region where the external mounting electrode 412A is located.

Internal conductor patterns 421A and 422A are formed on the bottom surface of the resin sheet 202A. The internal conductor patterns 421A and 422A are made of a metal such as copper (Cu). For example, the resin sheet 202A with the internal conductor patterns 421A and 422A preferably is implemented by performing an electrode patterning to a liquid crystal polymer having copper applied to one surface.

In the state in which the internal conductor pattern 421A is stacked on the resin sheet 201A, one end of the internal conductor pattern 421A in the extending direction reaches the position of the resin sheet 201A where the through-hole having the conductive paste 511P filled therein is formed. The other end of the internal conductor pattern 421A in the extending direction reaches an inside of a later-described through-hole 231 of the resin sheet 203A. More specifically, the other end of the internal conductor pattern 421A in the extending direction extends to the vicinity of the first X end and to the vicinity of the first Y end of the through-hole 231.

In the state in which the internal conductor pattern 422A is stacked on the resin sheet 201A, one end of the internal conductor pattern 422A in the extending direction reaches the position of the resin sheet 201A where the through-hole having the conductive paste 512P filled therein is formed. The other end of the internal conductor pattern 422A in the extending direction reaches an inside of the later-described through-hole 231 of the resin sheet 203A. More specifically, the other end of the internal conductor pattern 422A in the extending direction extends to the vicinity of the second X end and to the vicinity of the second Y end of the through-hole 231.

The resin sheet 202A is provided with a through-hole into which the conductive paste 521P is filled and a through-hole into which the conductive paste 522P is filled. The through-hole into which the conductive paste 521P is filled is located around the other end of the internal conductor pattern 421A and in a region where the internal conductor pattern 421A is located. Specifically, the through-hole into which the conductive paste 521P is filled is provided in the region where the internal conductor pattern 421A is located in the vicinity of the first X end and in the vicinity of the first Y end of the through-hole 231. The through-hole into which the conductive paste 522P is filled is provided around the other end of the internal conductor pattern 422A and in a region where the internal conductor pattern 422A is located. Specifically, the through-hole into which the conductive paste 522P is filled is provided in the region where the internal conductor pattern 422A is located in the vicinity of the second X end and in the vicinity of the second Y end of the through-hole 231.

The resin sheet 203A is provided with the through-hole 231 and cut-away portions 2331 and 2332. The through-hole 231 penetrates through the resin sheet 203A in the thickness direction.

The cut-away portions 2331 and 2332 are holes penetrating through the resin sheet 203A like the through-hole 231, and they are in communication with the through-hole 231. The cut-away portion 2331 is provided on the wall surface of the through-hole 231 at the first Y end, while the cut-away portion 2332 is provided on the wall surface of the through-hole 231 at the second Y end. In other words, the cut-away portions 2331 and 2332 are provided along the Y direction so as to be opposite to each other across the through-hole 231. The cut-away portions 2331 and 2332 are also provided around the opposing end surfaces of the through-hole 231 in the X direction. Specifically, the cut-away portion 2331 is provided around the through-hole into which the conductive paste 521P is filled, and the cut-away portion 2332 is provided around the through-hole into which the conductive paste 522P is filled.

A through-hole 241 is formed in the resin sheet 204A. The through-hole 241 penetrates through the resin sheet 204A in the thickness direction. The through-hole 241 is located in the same region with the same shape as the through-hole 231 in the resin sheet 203A. These through-holes 231 and 241 define a cavity.

A linear conductor 60 of a meander shape is provided on the surface of the resin sheet 205A. One end of the linear conductor 60 is located around a corner that is the first X end and the second Y end of the surface of the resin sheet 205A. The other end of the linear conductor 60 is located around the corner that is the second X end and the second Y end of the surface of the resin sheet 205A.

One end of the linear conductor 60 is connected to the external mounting electrode 411A with an interlayer connection conductor provided in the resin sheet 205A and including a via conductor 4511A and a sintered conductive paste 5511P, an interlayer connection conductor provided in the resin sheet 204A and including a via conductor 4411A and a sintered conductive paste 5411P, an interlayer connection conductor provided on the resin sheet 203A and including a via conductor 4311A and a sintered conductive paste 5311P, an interlayer connection conductor provided on the resin sheet 202A and including a via conductor 4211A and a sintered conductive paste 5211P, and an interlayer connection conductor provided on the resin sheet 201A and including a sintered conductive paste 5111P.

The other end of the linear conductor 60 is connected to the external mounting electrode 412A with an interlayer connection conductor provided on the resin sheet 205A and including a via conductor 4521A and a sintered conductive paste 5521P, an interlayer connection conductor provided on the resin sheet 204A and including a via conductor 4421A and a sintered conductive paste 5421P, an interlayer connection conductor provided on the resin sheet 203A and including a via conductor 4321A and a sintered conductive paste 5321P, an interlayer connection conductor provided on the resin sheet 202A and including a via conductor 4221A and a sintered conductive paste 5221P, and an interlayer connection conductor provided on the resin sheet 201A and including a sintered conductive paste 5121P.

With this configuration, a component-embedded substrate 10A of an LC parallel resonance circuit including the linear conductor 60 of the meander shape as an inductor is provided by using a chip-type capacitor for the electronic chip component 30.

In the configuration of having the cut-away portions 2321 and 2322 as described in the present preferred embodiment, the overflowing conductive paste 521P enters the cut-away portion 2321 via the gap of the cavity around the through-hole. The overflowing conductive paste 522P also enters the cut-away portion 2322 through the gap of the cavity around the through-hole. The conductive pastes 521P and 522P entering the cut-away portions 2321 and 2322 in this way stay there, and then, are melted and sintered due to the melting of the resin sheets. This forms a staying conductor 521F based on the conductive paste 521P and a staying conductor 522F based on the conductive paste 522P. Since the resin sheets 201A to 205A are uniformly pressurized as a whole, these staying conductors 521F and 522F stay at the position where the cut-away portions 2321 and 2322 are formed as illustrated in FIGS. 6A and 6B, even if the cavity is eliminated due to the melting of the resin sheets.

Since the cut-away portions 2331 and 2332 are present along the Y direction so as to be opposite to each other across the cavity and the electronic chip component 30, the staying conductors 521F and 522F are present along the Y direction so as to be opposite to each other across the electronic chip component 30. The cut-away portions 2331 and 2332 are also located at a distance from each other along the X direction.

This structure prevents the conductive pastes overflowing from the through-holes from being in communication with each other, i.e., prevent the staying conductors 521F and 522F from being in communication with each other, thus preventing an occurrence of short-circuiting between the external electrodes 31 and 32 and an occurrence of short-circuiting between the interlayer connection conductors 521 and 522. Specifically, the operation and effect similar to the first preferred embodiment are obtained.

Figure 7:
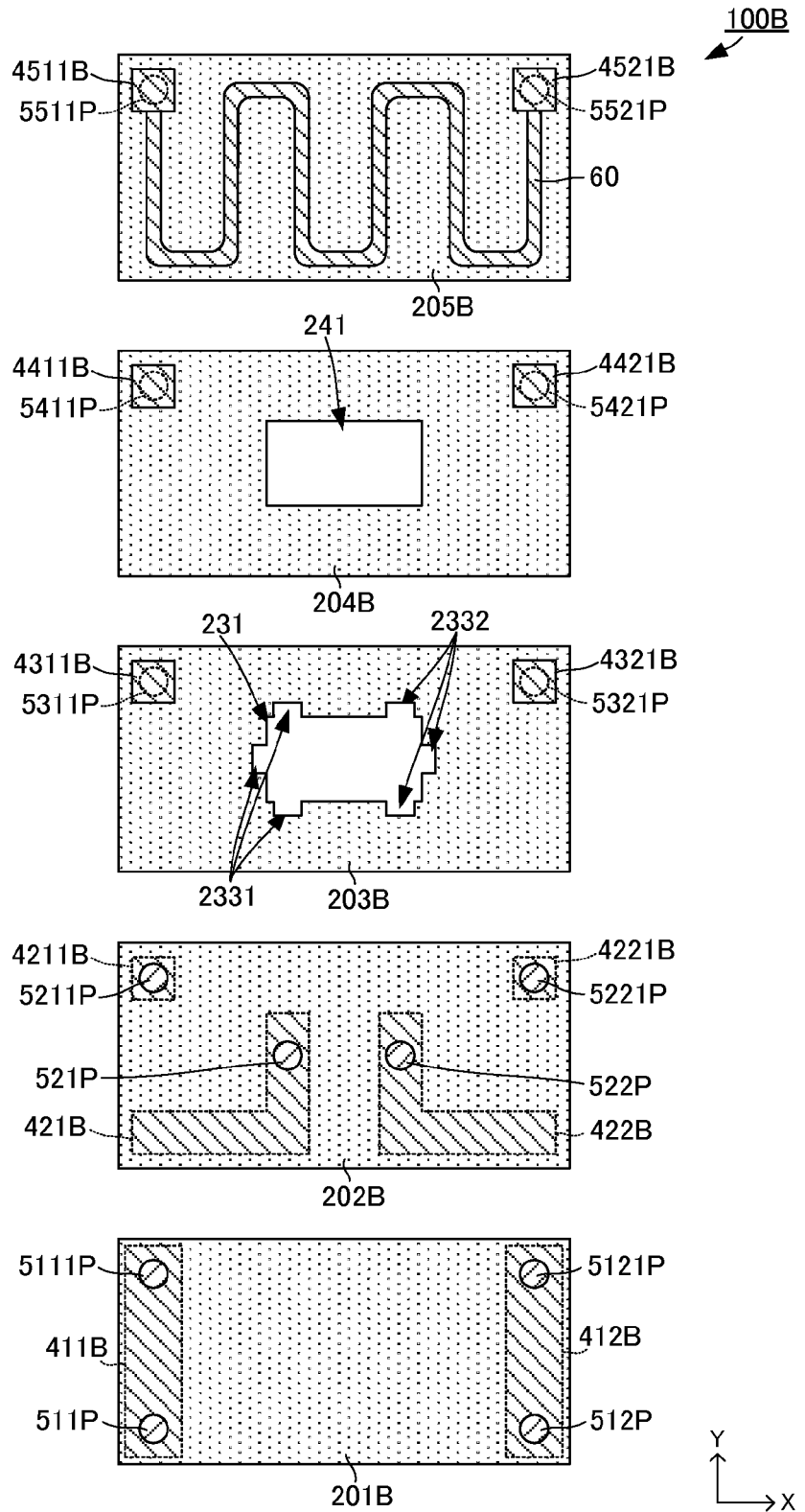
FIG. 7 is a plan view illustrating respective resin sheets forming a component-embedded substrate according to a third preferred embodiment of the present invention.
Figure 8A:
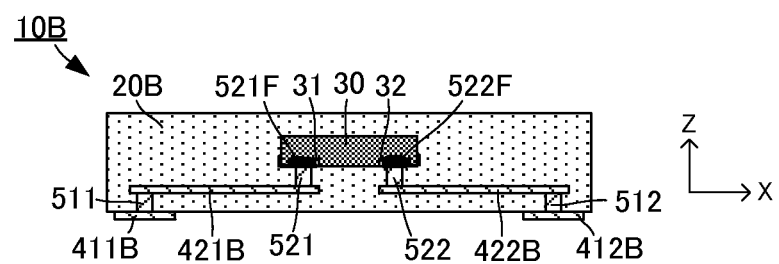
FIGS. 8A and 8B are each a sectional view for illustrating a structure of the component-embedded substrate and a perspective plan view of the electronic chip component on a mounting surface according to the third preferred embodiment of the present invention.
Figure 8B:
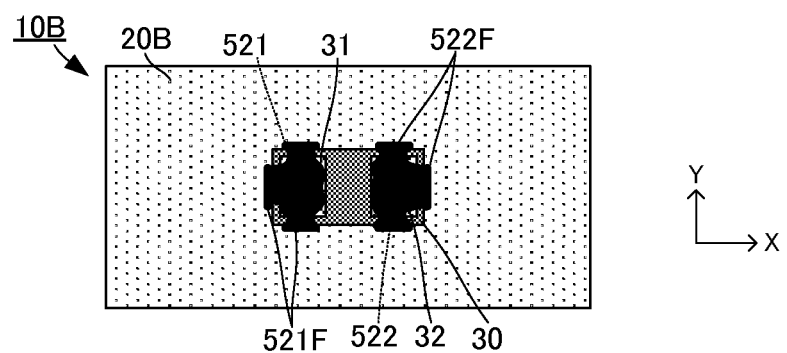

Next, a component-embedded substrate and a production method of the component-embedded substrate according to a third preferred embodiment of the present invention will be described with reference to the drawings. FIG. 7 is a plan view illustrating respective resin sheets of a component-embedded substrate according to the third preferred embodiment of the present invention. FIG. 8A is a sectional view illustrating a structure of the component-embedded substrate according to the third preferred embodiment of the present invention, and FIG. 8B is a perspective plan view of an electronic chip component on a mounting surface of the component-embedded substrate according to the third preferred embodiment of the present invention.

A component-embedded substrate 10B according to the present preferred embodiment is different from the component-embedded substrate 10A according to the second preferred embodiment in the shape of the cut-away portions and the positions where the through-holes into which the conductive pastes 521P and 522P are filled. However, the other configuration is the same as the component-embedded substrate 10A according to the second preferred embodiment. Therefore, only the portions different from the component-embedded substrate 10A according to the second preferred embodiment and its production method will specifically be described.

A resin sheet 202B is provided with a through-hole into which a conductive paste 521P is filled and a through-hole into which a conductive paste 522P is filled. These through-holes are disposed at almost the central position in the Y direction. Specifically, these through-holes are disposed such that the center of the external electrodes 31 and 32 of the electronic chip component 30 is brought into contact with the resin sheet 202B with the electronic chip component 30 being disposed in the cavity. The formation of the through-hole into which the conductive paste 521P is filled and the formation of the through-hole into which the conductive paste 522P is filled effectively cause self-alignment of the electronic chip component 30 during the process of forming interlayer connection conductors 521 and 522, such that the electronic chip component 30 is able to be more precisely disposed at a desired position and bonded to the interlayer connection conductors 521 and 522.

A plurality of cut-away portions 2331 and a plurality of cut-away portions 2332 as well as a through-hole 231 are formed in the resin sheet 203B. The plurality of cut-away portions 2331 is located in the vicinity of the end surface of the through-hole 231 at the first X end. One of the cut-away portions 2331 is located at the first X end of the through-hole 231, another one of the cut-away portions 2331 is located at the first Y end of the through-hole 231, and still another one of the cut-away portions 2331 is located at the second Y end of the through-hole 231. Specifically, the plurality of cut-away portions 2331 is located in the vicinity of the through-hole, into which the conductive paste 521P is filled, to surround the through-hole.

The plurality of cut-away portions 2332 is located in the vicinity of the end surface of the through-hole 231 at the second X end. One of the cut-away portions 2332 is located at the second X end of the through-hole 231, another one of the cut-away portions 2332 is located at the first Y end of the through-hole 231, and still another one of the cut-away portions 2332 is located at the second Y end of the through-hole 231. Specifically, the plurality of cut-away portions 2332 is located in the vicinity of the through-hole, into which the conductive paste 522P is filled, to surround the through-hole.

Since the plurality of cut-away portions is provided for one through-hole into which a conductive paste is filled, the entire capacity of the cut-away portions into which the conductive paste is inserted is able to be increased. Even if an amount of the conductive paste overflowing from the through-hole becomes large, an occurrence of short-circuiting between the external electrodes 31 and 32 and between the interlayer connection conductors 521 and 522 is reliably reduced. According to the configuration as in the present preferred embodiment in which the plurality of cut-away portions is disposed surround the through-hole into which the conductive paste is filled, the conductive paste is likely to be inserted into any one of the cut-away portions, even if the conductive paste overflows in any direction. Accordingly, an occurrence of short-circuiting between the external electrodes 31 and 32 and between the interlayer connection conductors 521 and 522 is more reliably prevented.

Figure 9:
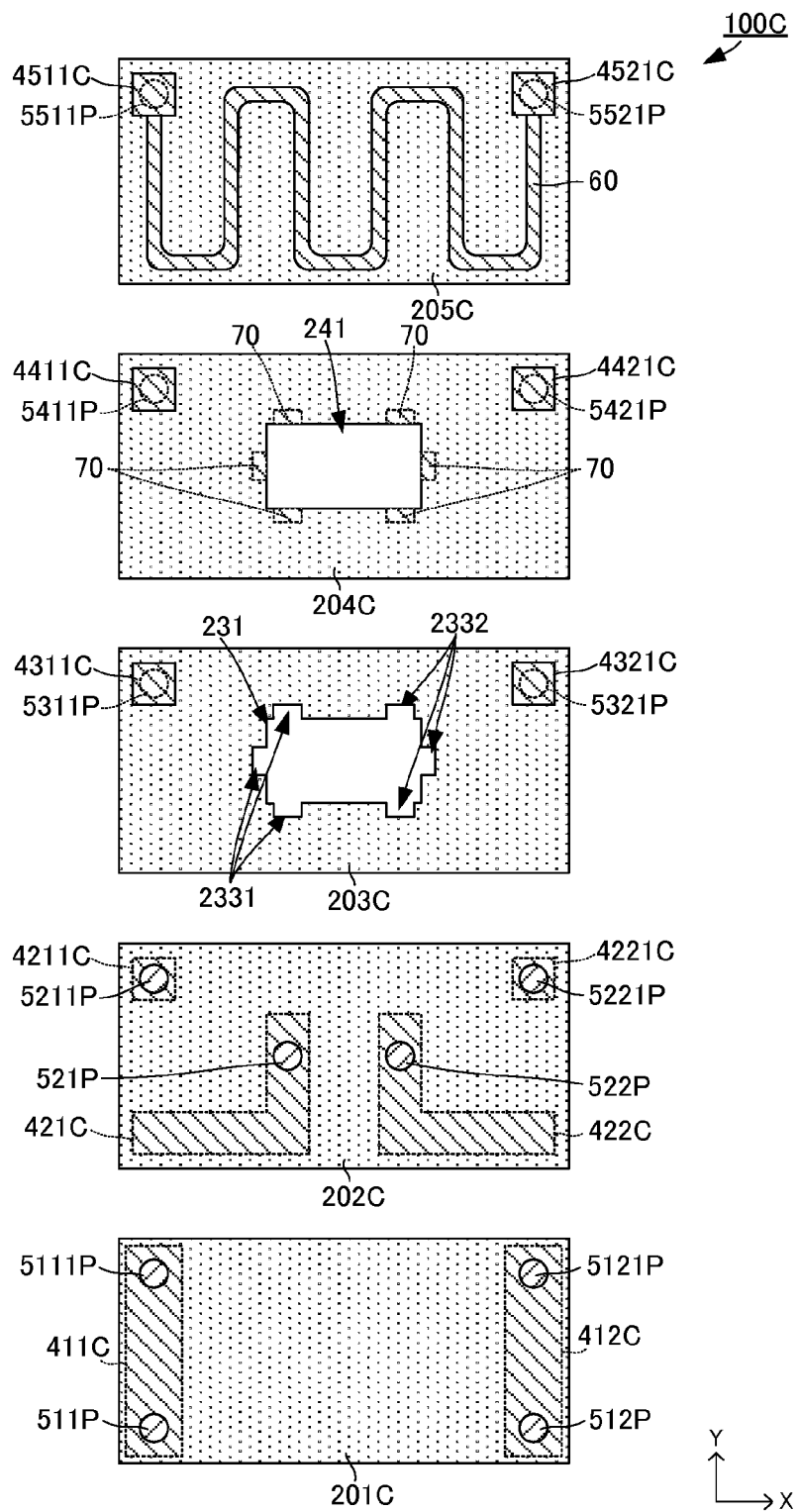
FIG. 9 is a plan view illustrating respective resin sheets forming a component-embedded substrate according to a fourth preferred embodiment of the present invention.
Figure 10A:
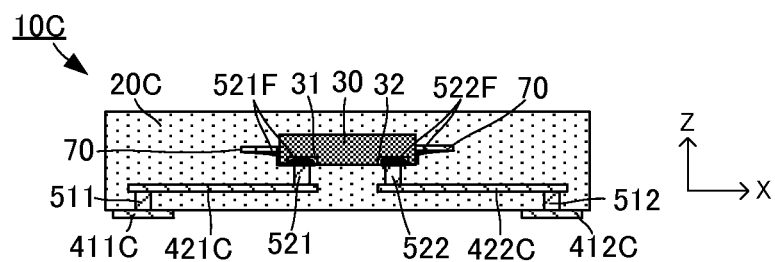
FIGS. 10A and 10B are each a sectional view for illustrating a structure of the component-embedded substrate and a perspective plan view of the electronic chip component on a mounting surface according to the fourth preferred embodiment of the present invention.
Figure 10B:
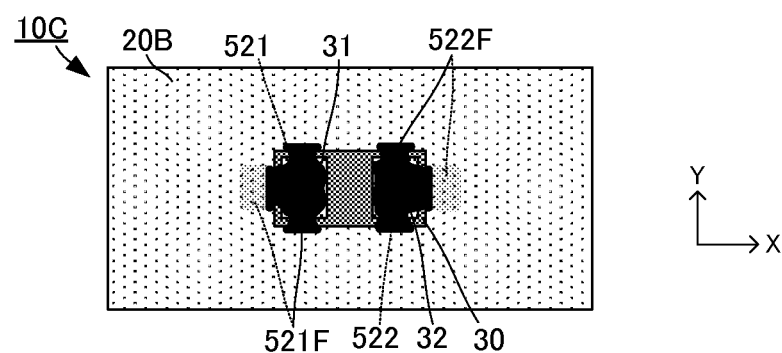

Next, a component-embedded substrate and a production method of the component-embedded substrate according to a fourth preferred embodiment of the present invention will be described with reference to the drawings. FIG. 9 is a plan view illustrating respective resin sheets of a component-embedded substrate according to the fourth preferred embodiment of the present invention. FIG. 10A is a sectional view illustrating a structure of the component-embedded substrate according to the fourth preferred embodiment of the present invention, and FIG. 10B is a perspective plan view of an electronic chip component on a mounting surface of the component-embedded substrate according to the fourth preferred embodiment of the present invention.

A component-embedded substrate 10C according to the present preferred embodiment is configured by adding a flow checking conductor pattern 70 to the component-embedded substrate 10B according to the third preferred embodiment. The other configuration is similar to the component-embedded substrate 10B according to the third preferred embodiment. Therefore, only the portions different from the component-embedded substrate 10B according to the third preferred embodiment and its production method will specifically be described.

A flow checking conductor pattern 70 is provided on the bottom surface of a resin sheet 204C. The flow checking conductor pattern 70 is provided in the region where cut-away portions 2331 and 2332 on a resin sheet 203C (having the same structure as the resin sheet 203B in the third preferred embodiment) face the resin sheet 204C. Specifically, the flow checking conductor pattern 70 is disposed on the surface that becomes an inner wall of the cut-away portion, when resin sheets 202C, 203C, and 204C are stacked.

With this configuration, when the conductive pastes entering the cut-away portions 2331 and 2332 are melted, the flow checking conductor pattern 70 becomes moist with the conductive pastes. According to this, the conductive pastes are more effectively guided to the cut-away portions 2331 and 2332 and allow them to stay there. This more reliably prevents an occurrence of short-circuiting between the external electrodes 31 and 32 and between the interlayer connection conductors 521 and 522.

Figure 11:
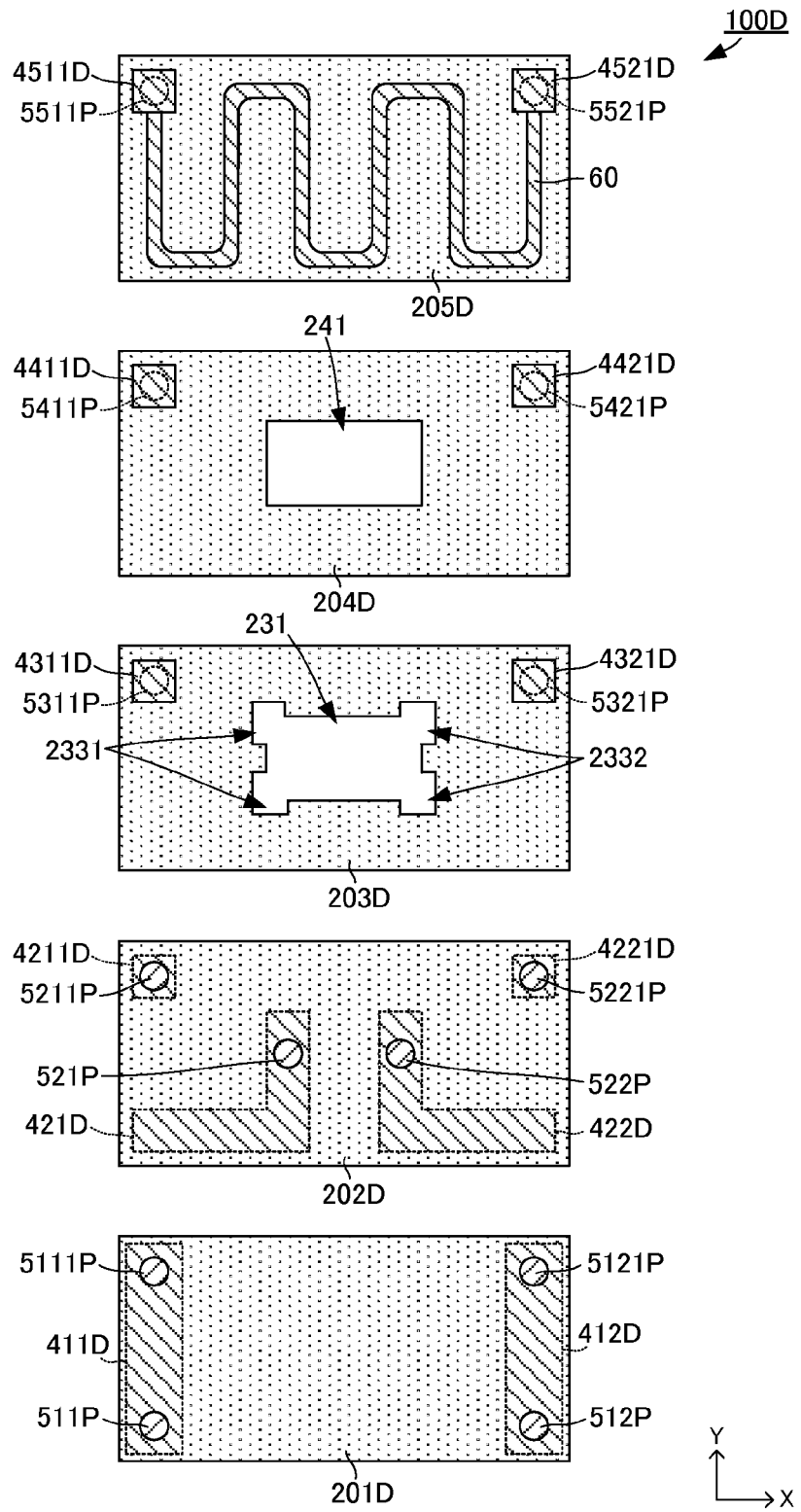
FIG. 11 is a plan view illustrating respective resin sheets forming a component-embedded substrate according to a fifth preferred embodiment of the present invention.
Figure 12A:
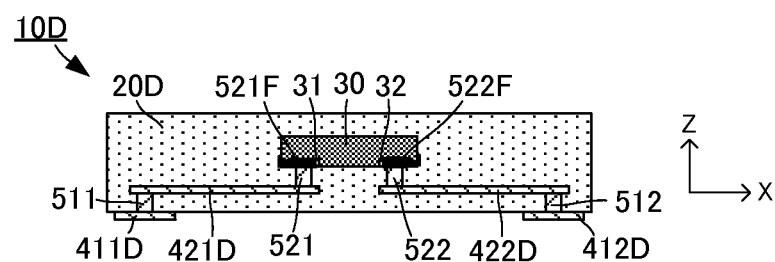
FIGS. 12A and 12B are each a sectional view for illustrating a structure of the component-embedded substrate and a perspective plan view of the electronic chip component on a mounting surface according to the fifth preferred embodiment of the present invention.
Figure 12B:
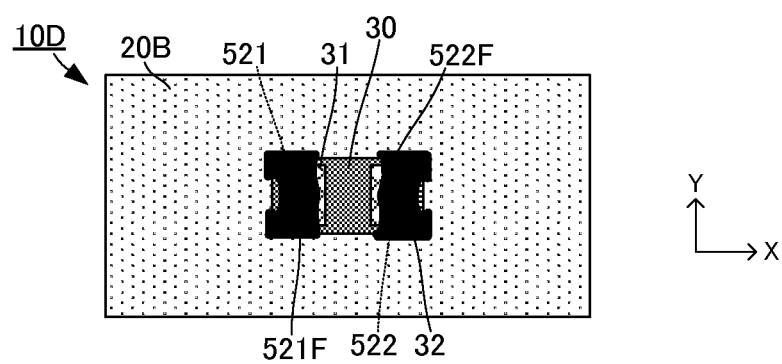

Next, a component-embedded substrate and a production method of the component-embedded substrate according to a fifth preferred embodiment of the present invention will be described with reference to the drawings. FIG. 11 is a plan view illustrating respective resin sheets of a component-embedded substrate according to the fifth preferred embodiment of the present invention. FIG. 12A is a sectional view illustrating a structure of the component-embedded substrate according to the fifth preferred embodiment of the present invention, and FIG. 12B is a perspective plan view of an electronic chip component on a mounting surface of the component-embedded substrate according to the fifth preferred embodiment of the present invention.

A component-embedded substrate 10D according to the present preferred embodiment is different from the component-embedded substrate 10B according to the third preferred embodiment in the shape of the cut-away portions 2331 and 2332. However, the other configuration is the same as the component-embedded substrate 10B according to the third preferred embodiment. Therefore, only the portions different from the component-embedded substrate 10B according to the third preferred embodiment and its production method will specifically be described.

A plurality of cut-away portions 2331 and 2332 and a through-hole 231 are provided on a resin sheet 203D. The plurality of cut-away portions 2331 and 2332 is located at the corners of the through-hole 231. More specifically, one of the cut-away portions 2331 is located at the corner at the first X end and at the first Y end of the through-hole 231, and the other one of the cut-away portions 2331 is located at the corner at the first X end and at the second Y end of the through-hole 231. One of the cut-away portions 2332 is located at the corner at the second X end and at the first Y end of the through-hole 231, and the other one of the cut-away portions 2332 is located at the corner at the second X end and at the second Y end of the through-hole 231.

This configuration also prevents an occurrence of short-circuiting between the external electrodes 31 and 32 and between the interlayer connection conductors 521 and 522, as in the above preferred embodiments.

Figure 13A:
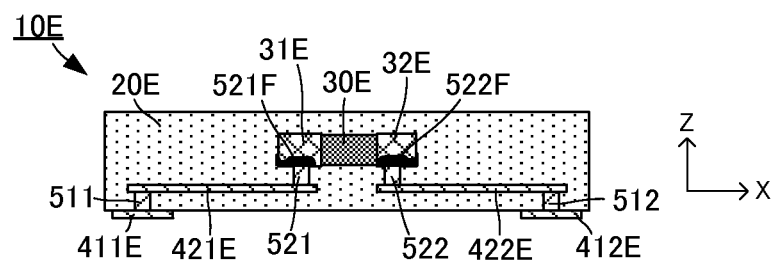
FIGS. 13A and 13B are each a sectional view for illustrating a structure of the component-embedded substrate and a perspective plan view of the electronic chip component on a mounting surface according to a sixth preferred embodiment of the present invention.

Next, a component-embedded substrate and a production method of the component-embedded substrate according to a sixth preferred embodiment of the present invention will be described with reference to the drawings. FIG. 13A is a sectional view illustrating a structure of a component-embedded substrate according to the sixth preferred embodiment of the present invention, and FIG. 13B is a perspective plan view of an electronic chip component on a mounting surface of the component-embedded substrate according to the sixth preferred embodiment of the present invention.

A component-embedded substrate 10E according to the present preferred embodiment is different from the component-embedded substrate 10B according to the third preferred embodiment in the structure of an electronic chip component 30E. However, the other configuration is the same as the component-embedded substrate 10B according to the third preferred embodiment. Therefore, only the portions different from the component-embedded substrate 10B according to the third preferred embodiment and its production method will specifically be described.

The electronic chip component 30E is provided with external electrodes 31E and 32E at both ends of a body of the component. The external electrode 31E extends to a top surface, bottom surface, and a side surface from a first end surface of the component body. The external electrode 32E extends to the top surface, bottom surface, and a side surface from a second end surface (opposite to the first end surface) of the component body.

Figure 13B:
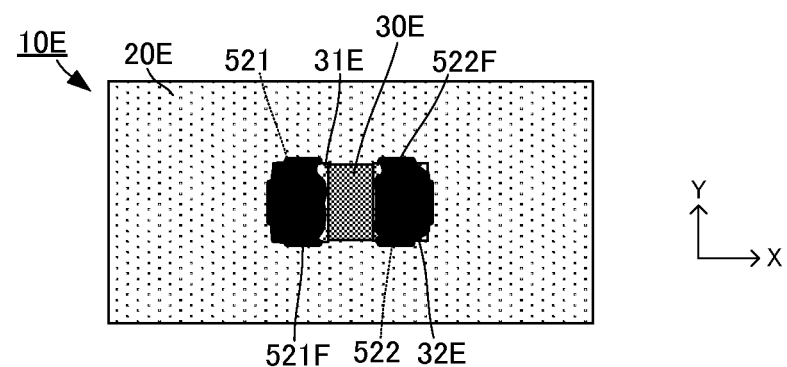

With this configuration, a staying conductor 521F wetly spreads over three surfaces (the external electrode located on the first end surface and both side surfaces of the electronic chip component 30E) of the external electrode 31E as illustrated in FIG. 13B. A staying conductor 522F wetly spreads over three surfaces (the external electrode located on the second end surface and both side surfaces of the electronic chip component 30E) of the external electrode 32E.

With the configuration of the present preferred embodiment, the electronic chip component 30E is able to be electrically and physically connected to the internal conductor patterns 421 and 422 of the substrate body 20E with not only the interlayer connection conductors 521 and 522 but also the staying conductors 521F and 522F.

Figure 14:
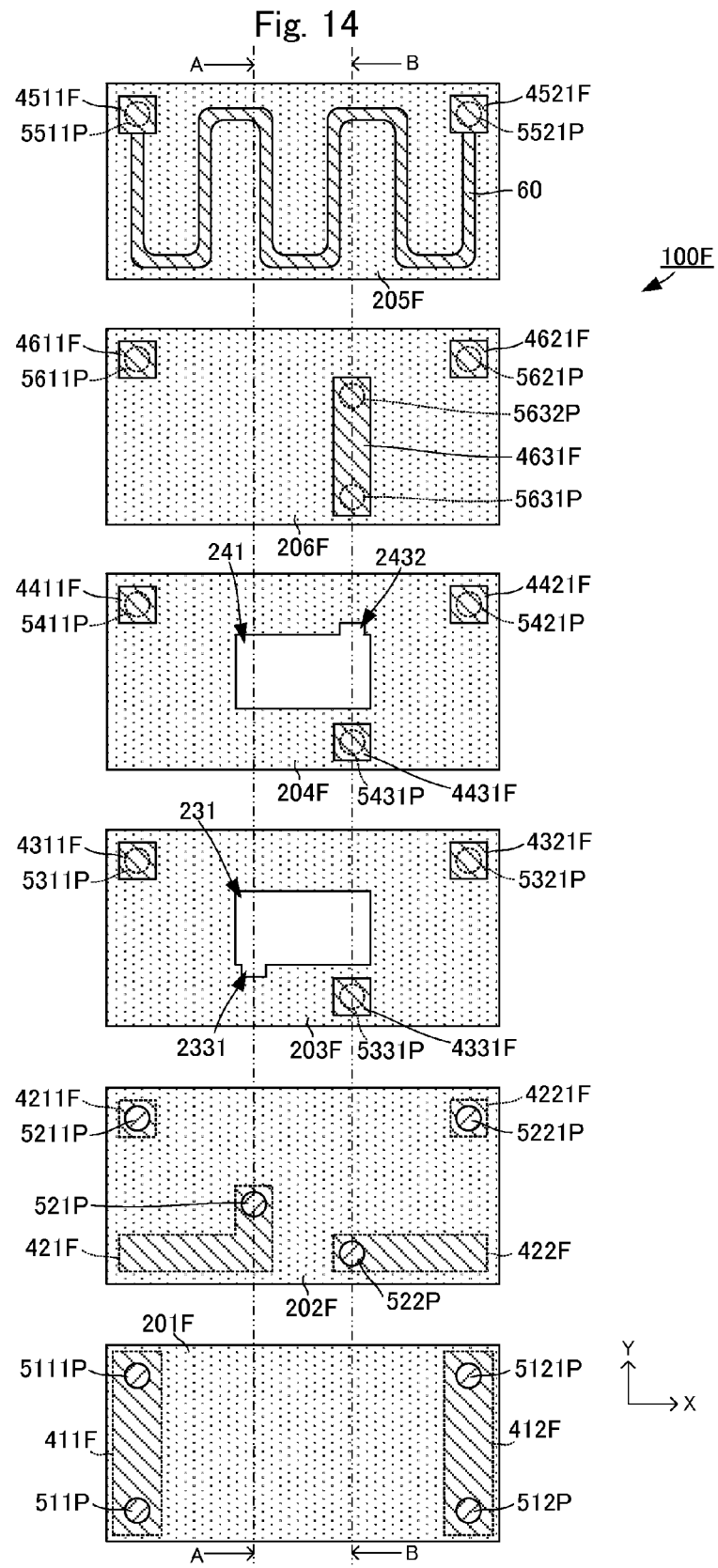
FIG. 14 is a plan view illustrating respective resin sheets forming a component-embedded substrate according to a seventh preferred embodiment of the present invention.
Figure 15A:
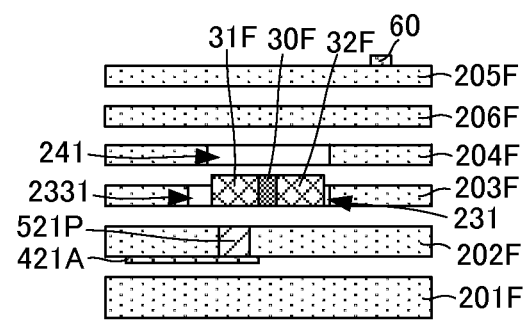
FIGS. 15A and 15B are side sectional views each illustrating a stacked manner of the respective resin sheets in the component-embedded substrate according to the seventh preferred embodiment of the present invention.
Figure 15A:
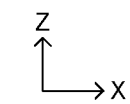
Figure 15B:
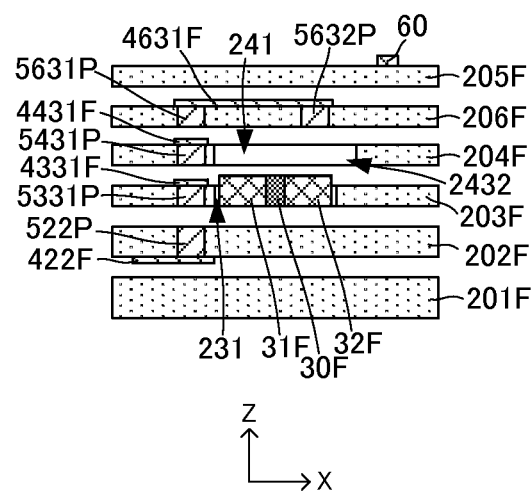
Figure 16A:
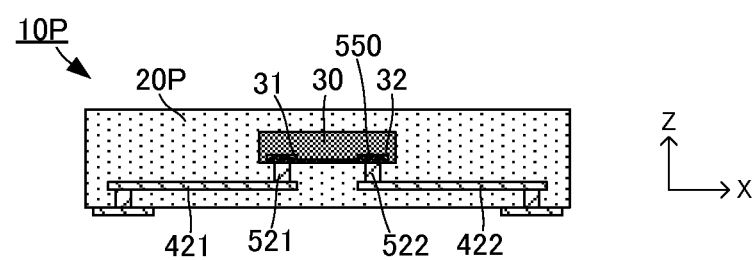
FIGS. 16A and 16B are a view for describing a problem of a component-embedded substrate having a conventional configuration.
Figure 16B:
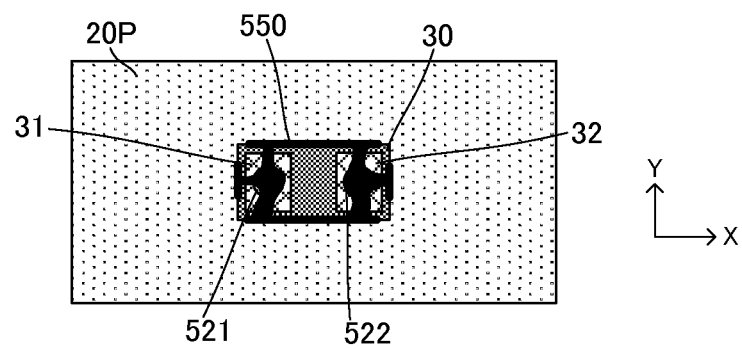

Next, a component-embedded substrate and a production method of the component-embedded substrate according to a seventh preferred embodiment of the present invention will be described with reference to the drawings. FIG. 14 is a plan view illustrating respective resin sheets forming a component-embedded substrate according to the seventh preferred embodiment of the present invention. FIGS. 15A and 15B are side sectional views each illustrating a stacked manner of the respective resin sheets in the component-embedded substrate according to the seventh preferred embodiment of the present invention. FIG. 15A is a sectional view along a line A-A in FIG. 14, and FIG. 15B is a sectional view along a line B-B in FIG. 14.

A component-embedded substrate 10F according to the present preferred embodiment is different from the component-embedded substrate 10A according to the second preferred embodiment in the structure of an electronic chip component 30F and a connection manner between an internal conductor pattern 422F and an external electrode 32F of the electronic chip component 30E. However, the other configuration is the same as the component-embedded substrate 10A according to the second preferred embodiment. Therefore, only the portions different from the component-embedded substrate 10A according to the second preferred embodiment and its production method will specifically be described.

The component-embedded substrate 10F includes resin sheets 201F, 202F, 203F, 204F, 206F, and 205F stacked in this order from the bottom surface.

The other end of the internal conductor pattern 422F located on the bottom surface of the resin sheet 202F is connected to one end of an internal conductor pattern 4631F located on the surface of the resin sheet 206F through an interlayer connection conductor which is located on the resin sheet 202F and defined by a sintered conductive paste 522P filled in a through-hole, an interlayer connection conductor which is located on the resin sheet 203F and defined by a conductive paste 5331P filled in a through-hole and a via conductor 4331F, an interlayer connection conductor which is located in the resin sheet 204F and defined by a sintered conductive paste 5431P filled in a through-hole and a via conductor 4431F, and an interlayer connection conductor which is located on the resin sheet 206F and defined by a sintered conductive paste 5631P filled in a through-hole. The other end of the internal conductor pattern 4631F is located on the position corresponding to the through-holes 231 and 241. A through-hole into which a conductive paste 5632P is filled is provided at this position.

A through-hole 231 and a cut-away portion 2331 are formed in the resin sheet 203F. They are the same as the through-hole 231 and the cut-away portion 2331 formed in the resin sheet 203A in the second preferred embodiment.

A through-hole 241 and a cut-away portion 2432 are formed in the resin sheet 204F. The through-hole 241 is the same as the through-hole 241 formed in the resin sheet 204A in the second preferred embodiment. The cut-away portion 2432 preferably has the same shape and on the same position as the cut-away portion 2332 in the second preferred embodiment in a plan view of a stacked body (when the stacked body is viewed in a stacking direction).

With this configuration, the external electrode 31F of the electronic chip component 30F is in contact with the conductive paste 521P from the bottom surface, while the external electrode 32F is in contact with the conductive paste 5632P from the top surface. Even in this case, the conductive paste 521P overflowing from the through-hole enters the cut-away portion 2331, and the conductive paste 5632P overflowing from the through-hole enters the cut-away portion 2432. Thus, the operation and effect same as the above preferred embodiments are obtained.

The cut-away portion is not limited to the shapes described in the respective preferred embodiments, and may have other shapes. However, the width of the cut-away portion is appropriately set, because the alignment precision of the electronic chip component with the cavity is deteriorated, and the electronic chip component might move during hot pressing, when the width of the cut-away portion becomes closer to the length of each wall surface of the through-hole forming the cavity.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A production method of a component-embedded substrate for producing the component-embedded substrate by stacking a plurality of resin sheets, each having thermoplasticity, and by performing hot pressing to the stacked resin sheets with an electronic chip component being held between the resin sheets, the production method comprising:
   a step of forming a through-hole, into which a conductive paste is filled, at a position of the resin sheets corresponding to an external electrode of the electronic chip component;
   a step of forming a cavity and a cut-away portion in one of the resin sheets corresponding to a position where the electronic chip component is to be disposed, the cavity having an area that is the same or substantially the same as an area of the electronic chip component in a plan view, the cavity having an outer shape following an outer shape of the electronic chip component, the cut-away portion adjoining the cavity;
   a step of inserting the electronic chip component into the cavity; and
   a step of stacking the plurality of resin sheets with the electronic chip component being disposed into the cavity, and performing hot pressing to the stacked resin sheets; wherein
   the external electrode includes a first external electrode and a second external electrode provided respectively to a vicinity of both ends of the electronic chip component in a first direction;

the through-hole includes a first through-hole and a second through-hole into which the conductive paste is filled, the first through-hole and the second through-hole being formed for each of the first external electrode and the second external electrode, respectively; and the cut-away portion includes a first cut-away portion and a second cut-away portion which are independently formed for each of the first external electrode and the second external electrode, respectively.

2. The production method of a component-embedded substrate according to claim 1, wherein the cut-away portion is formed in a vicinity of a position where the external electrode of the electronic chip component is disposed.

3. The production method of a component-embedded substrate according to claim 2, wherein the cut-away portion is formed in at least one of the resin sheets adjacent to a resin sheet provided with the through-hole into which the conductive paste is filled.

4. The production method of a component-embedded substrate according to claim 1, wherein the cut-away portion formed for the first external electrode and the cut-away portion formed for the second external electrode are formed opposite to each other sandwiching the electronic chip component therebetween in a state in which the electronic chip component is disposed into the cavity.

5. The production method of a component-embedded substrate according to claim 1, wherein a number of at least one of the cut-away portion formed for the first external electrode and the cut-away portion formed for the second external electrode is two or more.

6. The production method of a component-embedded substrate according to claim 1, wherein the first through-hole, into which the conductive paste is filled, for the first external electrode is disposed around one end in a second direction which is perpendicular or substantially perpendicular to both the first direction and a thickness direction of the electronic chip component; and the second through-hole, into which the conductive paste is filled, for the second external electrode is disposed around another end in the second direction.

7. The production method of a component-embedded substrate according to claim 1, further comprising a step of forming a flow checking conductor pattern on an inner wall of the cut-away portion.

8. The production method of a component-embedded substrate according to claim 1, wherein a width of the cut-away portion is larger than a gap between a side surface of the cavity and the electronic chip component when the electronic chip component is disposed in the cavity.

9. The production method of a component-embedded substrate according to claim 1, further comprising a step of forming a linear conductor and a resist film covering the linear conductor on a surface of the substrate.

10. The production method of a component-embedded substrate according to claim 1, further comprising a step of forming a plurality of the cut-away portions so as to surround the through-hole.

11. The production method of a component-embedded substrate according to claim 1, wherein one of the first and second external electrodes extends to a top surface, a bottom surface and a side surface of the electronic chip component.

12. The production method of a component-embedded substrate according to claim 1, wherein a staying conductor which is made of the conductive paste is formed on a bottom surface and a side surface of the electronic chip component.

* * * * *